US011001078B2

(12) United States Patent
Huska

(10) Patent No.: US 11,001,078 B2
(45) Date of Patent: May 11, 2021

(54) INTERCHANGEABLE GUIDE HEAD FOR TRANSFER MECHANISM

(71) Applicant: Rohinni, LLC, Coeur d'Alene, ID (US)

(72) Inventor: Andrew Huska, Liberty Lake, WA (US)

(73) Assignee: Rohinni, LLC, Coeur d'Alene, ID (US)

( * ) Notice: Subject to any disclaimer, the term of this patent is extended or adjusted under 35 U.S.C. 154(b) by 281 days.

(21) Appl. No.: 16/146,966

(22) Filed: Sep. 28, 2018

(65) Prior Publication Data

US 2020/0101760 A1 Apr. 2, 2020

(51) Int. Cl.
*B23P 19/00* (2006.01)
*B41J 2/27* (2006.01)
*H01L 21/67* (2006.01)
*B41J 2/235* (2006.01)

(52) U.S. Cl.
CPC ............ *B41J 2/27* (2013.01); *B41J 2/235* (2013.01); *H01L 21/67011* (2013.01); *Y10T 29/53174* (2015.01)

(58) Field of Classification Search
USPC ......... 29/739, 430, 525.02, 564.6, 729, 747, 29/760, 771, 787, 874
See application file for complete search history.

(56) References Cited

U.S. PATENT DOCUMENTS

| 7,560,303 | B2* | 7/2009 | Wang | G06K 19/07752 |
| | | | | 438/107 |
| 9,633,883 | B2* | 4/2017 | Huska | G02F 1/133606 |

| 2008/0124842 | A1 | 5/2008 | Wang et al. |
| 2014/0142740 | A1 | 5/2014 | Prakapenka et al. |
| 2016/0276205 | A1 | 9/2016 | Huska et al. |
| 2018/0261525 | A1 | 9/2018 | Tolentino et al. |
| 2018/0286838 | A1 | 10/2018 | Huska et al. |
| 2020/0105570 | A1 | 4/2020 | Peterson et al. |
| 2020/0286770 | A1 | 9/2020 | Peterson et al. |

FOREIGN PATENT DOCUMENTS

| JP | 08266980 | 8/1996 |
| RU | 2071144 | 12/1996 |
| RU | 2498449 | 11/2013 |
| TW | 201812286 | 4/2018 |

(Continued)

OTHER PUBLICATIONS

The PCT Search Report and Written Opinion dated Dec. 19, 2019 for PCT Application No. PCT/US2019/053199, 7 pages.

(Continued)

*Primary Examiner* — Thiem D Phan
(74) *Attorney, Agent, or Firm* — Lee & Hayes, P.C.

(57) ABSTRACT

An apparatus including a dot matrix transfer head that includes an impact wire housing. A plurality of impact wires are disposed within the impact wire housing and extend out of the impact wire housing. A splaying element attached to a bottom surface of the impact wire housing. The plurality of impact wires extend into and through the splaying element. A guide head attached to a bottom surface of the splaying element. The guide head includes multiple holes that arrange the plurality of impact wires in a matrix configuration. The splaying element is designed to direct the plurality of impact wires toward the multiple holes in the guide head.

13 Claims, 6 Drawing Sheets

(56) References Cited

FOREIGN PATENT DOCUMENTS

TW          M557658         4/2018
TW         201831915        9/2018
WO       WO2012142177      10/2012

OTHER PUBLICATIONS

Office Action for U.S. Appl. No. 16/294,756, dated Aug. 12, 2020, Peterson, "Multi-Axis Movement for Transfer of Semiconductor Devices", 14 Pages.
The PCT Search Report and Written Opinion dated Jun. 4, 2020 for PCT Applciation No. PCT/US2020/020347, 7 pages.
The Taiwanese Office Action dated Sep. 22, 2020 for Taiwanese Patent Application No. 108135266, a counterpart of U.S. Appl. No. 16/147,055, 5 pages.

* cited by examiner

INTERCHANGEABLE GUIDE HEAD FOR TRANSFER MECHANISM

CROSS REFERENCE TO RELATED PATENT APPLICATIONS

This application incorporates U.S. patent application Ser. No. 14/939,896, filed on Nov. 12, 2015, entitled "Apparatus for Transfer of Semiconductor Devices," now issued as U.S. Pat. No. 9,633,883, and U.S. patent application Ser. No. 15/978,094, filed on May 12, 2018, entitled "Method and Apparatus for Multiple Direct Transfers of Semiconductor Devices," in their entireties by reference.

BACKGROUND

Semiconductor devices are electrical components that utilize semiconductor material, such as silicon, germanium, gallium arsenide, etc. Semiconductor devices are typically manufactured as single discrete devices or as integrated circuits (ICs). Examples of single discrete devices include electrically-actuatable elements such as light-emitting diodes (LEDs), diodes, transistors, resistors, capacitors, fuses, and the like.

The fabrication of semiconductor devices typically involves an intricate manufacturing process with a myriad of steps. The end-product of the fabrication is a "packaged" semiconductor device. The "packaged" modifier refers to the enclosure and protective features built into the final product as well as the interface that enables the device in the package to be incorporated into an ultimate circuit.

The conventional fabrication process for semiconductor devices starts with handling a semiconductor wafer. The wafer is diced into a multitude of "unpackaged" semiconductor devices. The "unpackaged" modifier refers to an unenclosed semiconductor device without protective features. Herein, unpackaged semiconductor devices may be called semiconductor device die, or just "die" for simplicity. A single semiconductor wafer may be diced to create die of various sizes, so as to form upwards of more than 100,000 or even 1,000,000 die from the semiconductor wafer (depending on the starting size of the semiconductor), and each die has a certain quality. The unpackaged die are then "packaged" via a conventional fabrication process discussed briefly below. The actions between the wafer handling and the packaging may be referred to as "die preparation."

In some instances, the die preparation may include sorting the die via a "pick and place process," whereby diced die are picked up individually and sorted into bins. The sorting may be based on the forward voltage capacity of the die, the average power of the die, and/or the wavelength of the die.

Typically, the packaging involves mounting a die into a plastic or ceramic package (e.g., mold or enclosure). The packaging also includes connecting the die contacts to pins/wires for interfacing/interconnecting with ultimate circuitry. The packaging of the semiconductor device is typically completed by sealing the die to protect it from the environment (e.g., dust).

A product manufacturer then places packaged semiconductor devices in product circuitry. Due to the packaging, the devices are ready to be "plugged in" to the circuit assembly of the product being manufactured. Additionally, while the packaging of the devices protects them from elements that might degrade or destroy the devices, the packaged devices are inherently larger (e.g., in some cases, around 10 times the thickness and 10 times the area, resulting in 100 times the volume) than the die found inside the package. Thus, the resulting circuit assembly cannot be any thinner than the packaging of the semiconductor devices.

As mentioned previously, a single semiconductor wafer may be diced to create more than 100,000 or 1,000,000 die from the semiconductor wafer. Inasmuch as the die may be micro-sized (e.g., 12 microns to 200 microns in height, and 20 microns to 300 microns in width), the machines used in transferring semiconductor die require extreme precision. Thus, transfer mechanisms are often built with a specific design purpose in mind and are built with tight constraints to ensure precision and accuracy. However, these transfer mechanisms often lack variability and adaptability to different applications or manufacturing purposes. For example, a transfer mechanism will be used to transfer die for a specific product and may have to be reconfigured or adjusted to transfer die for another product. The reconfiguration can be time consuming, inefficient, and, at times, requires tearing down and rebuilding components on a machine.

BRIEF DESCRIPTION OF THE DRAWINGS

The Detailed Description is set forth with reference to the accompanying figures. In the figures, the left-most digit(s) of a reference number identifies the figure in which the reference number first appears. The use of the same reference numbers in different figures indicates similar or identical items. Furthermore, the drawings may be considered as providing an approximate depiction of the relative sizes of the individual components within individual figures. However, the drawings are not to scale, and the relative sizes of the individual components, both within individual figures and between the different figures, may vary from what is depicted. In particular, some of the figures may depict components as a certain size or shape, while other figures may depict the same components on a larger scale or differently shaped for the sake of clarity.

DETAILED DESCRIPTION

Figure 1A:
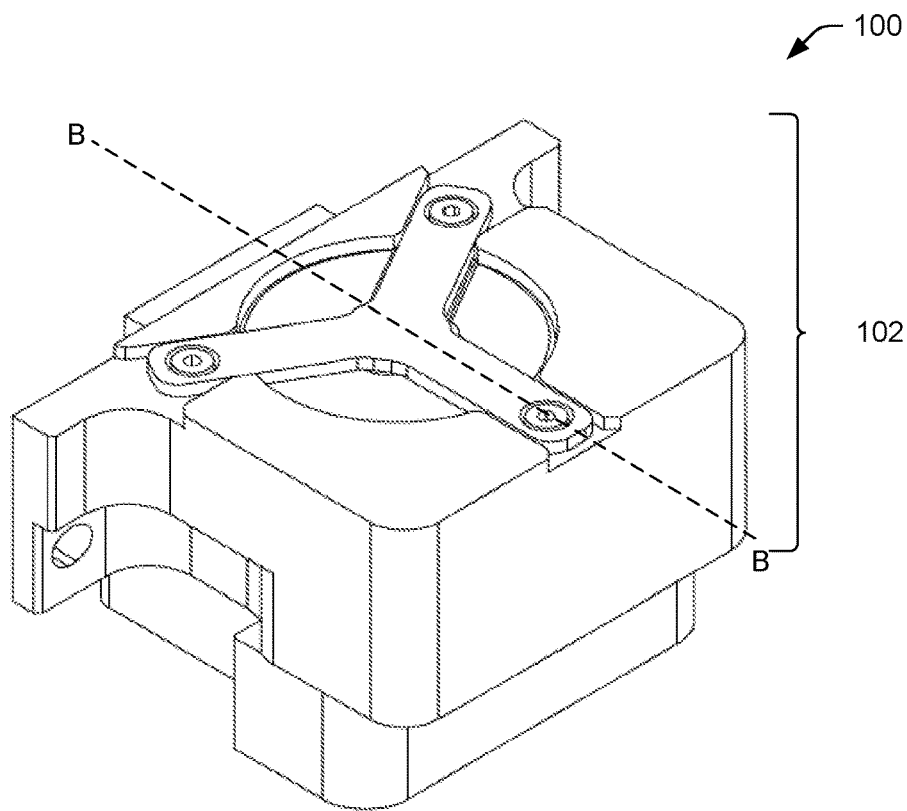
FIG. 1A illustrates a top perspective view of an embodiment of a dot matrix transfer head.

This disclosure is directed generally to a transfer mechanism that directly transfers semiconductor device die from one substrate to another substrate, such as a die substrate (e.g., blue tape, semiconductor wafer on tape, etc.), a circuit substrate (e.g., pcb, flexible or rigid, metal or plastic, surface of a circuit), another die (i.e., die stacked on die, where the die to be stacked on acts as the "substrate" to receive the transferred die), etc., and to the general process for achieving the same. In an embodiment, the transfer mechanism may function to transfer unpackaged die directly from a substrate such as a "wafer tape" to a product substrate, such as a circuit substrate. The direct transfer of unpackaged die may significantly reduce the thickness of an end product compared to a similar product produced by conventional means, as well as the amount of time and/or cost to manufacture the product substrate.

For the purpose of this description, the term "substrate" refers to any substance on which, or to which, a process or action occurs. Further, the term "product" refers to the desired output from a process or action, regardless of the state of completion. Thus, a product substrate may refer to any substance on which or to which, a process or action is caused to occur for a desired output. The wafer tape may also be referred to herein as the semiconductor device die substrate, or simply a die substrate.

In an embodiment, the transfer mechanism may transfer a semiconductor device die directly from a wafer tape to a product substrate without "packaging" the die. The transfer mechanism may be disposed vertically above the wafer tape so as to press down on the die via the wafer tape toward the product substrate. This process of pressing down on the die may cause the die to peel off of the wafer tape, starting at the sides of the die until the die separates from the wafer tape to be attached to the product substrate. That is, by reducing the adhesion force between the die and the wafer tape, and increasing the adhesion force between the die and the product substrate, the die may be transferred.

In an embodiment, the transfer mechanism may include a multi-needle transfer head, similar to the print heads used in dot matrix printers, and which therefore may also be referred to hereinafter as a "dot matrix transfer head." The dot matrix transfer head may include a plurality of impact wires (also referred to as "needles" or "pins") that may be individually actuated concurrently or sequentially. The plurality of impact wires may be implemented to directly transfer a plurality of semiconductor device die from the first substrate, such as a wafer tape, to the second substrate, such as a product substrate. The dot matrix transfer head may further include a housing, the housing may include an actuating assembly configured to control actuation of the plurality of impact wires. The dot matrix transfer head may also include a splaying element. The splaying element may be configured to spread the plurality of impact wires at a specified distance from each other. In an embodiment, the splaying element may be included as part of the housing. The dot matrix transfer head may also include a guide or guide head that may attach to a side of the splaying element and/or the housing. The guide may be configured to maintain a lateral position of the plurality of impact wires during a transfer process. In an embodiment, the guide may contact a surface of the wafer tape. However, in other embodiments, the guide may be disposed proximate to a surface of the wafer tape.

Figure 1B:
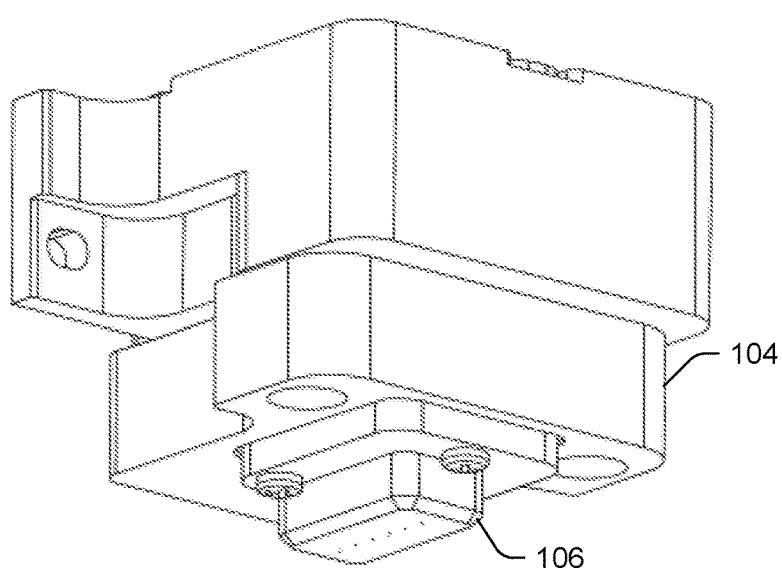
FIG. 1B illustrates a bottom perspective view of an embodiment of a dot matrix transfer head.

FIGS. 1A and 1B illustrate an embodiment of a transfer mechanism that may be used to directly transfer unpackaged semiconductor components (or "die") from a wafer tape to a product substrate. As shown in FIGS. 1A and 1B the transfer mechanism may include a dot matrix transfer head 100. In an embodiment, the dot matrix transfer head 100 may include multiple components. For example, the dot matrix transfer head 100 may include an impact wire housing 102, a splaying element 104, and a guide head 106 (or "guide"). While described as individual components, in an embodiment, any one of the components previously mentioned may be incorporated as a portion of another component. In an embodiment, the multiple components may further include subcomponents, described further herein below with respect to FIGS. 2-5. In an embodiment, and as shown in FIG. 1, the impact wire housing 102 may be disposed adjacent to and/or above the splaying element 104; the splaying element 104 may be disposed adjacent to and between the impact wire housing 102 and the guide head 106; and the guide head may disposed adjacent to and below the splaying element 104. While described from top to bottom, as shown in FIG. 1, the dot matrix transfer head 100 may be implemented in a transfer machine in a different orientation, in another embodiment. For example, the dot matrix transfer head 100 may be mounted in a transfer machine such that the components (102, 104, 106) may be disposed adjacent to one another in a lateral direction rather than a vertical direction as depicted in FIG. 1. FIG. 1 merely depicts an example orientation of the dot matrix transfer head 100 and it is contemplated that in other embodiments, the dot matrix transfer head 100 may positioned in any desired orientation for a specific implementation.

Figure 2A:
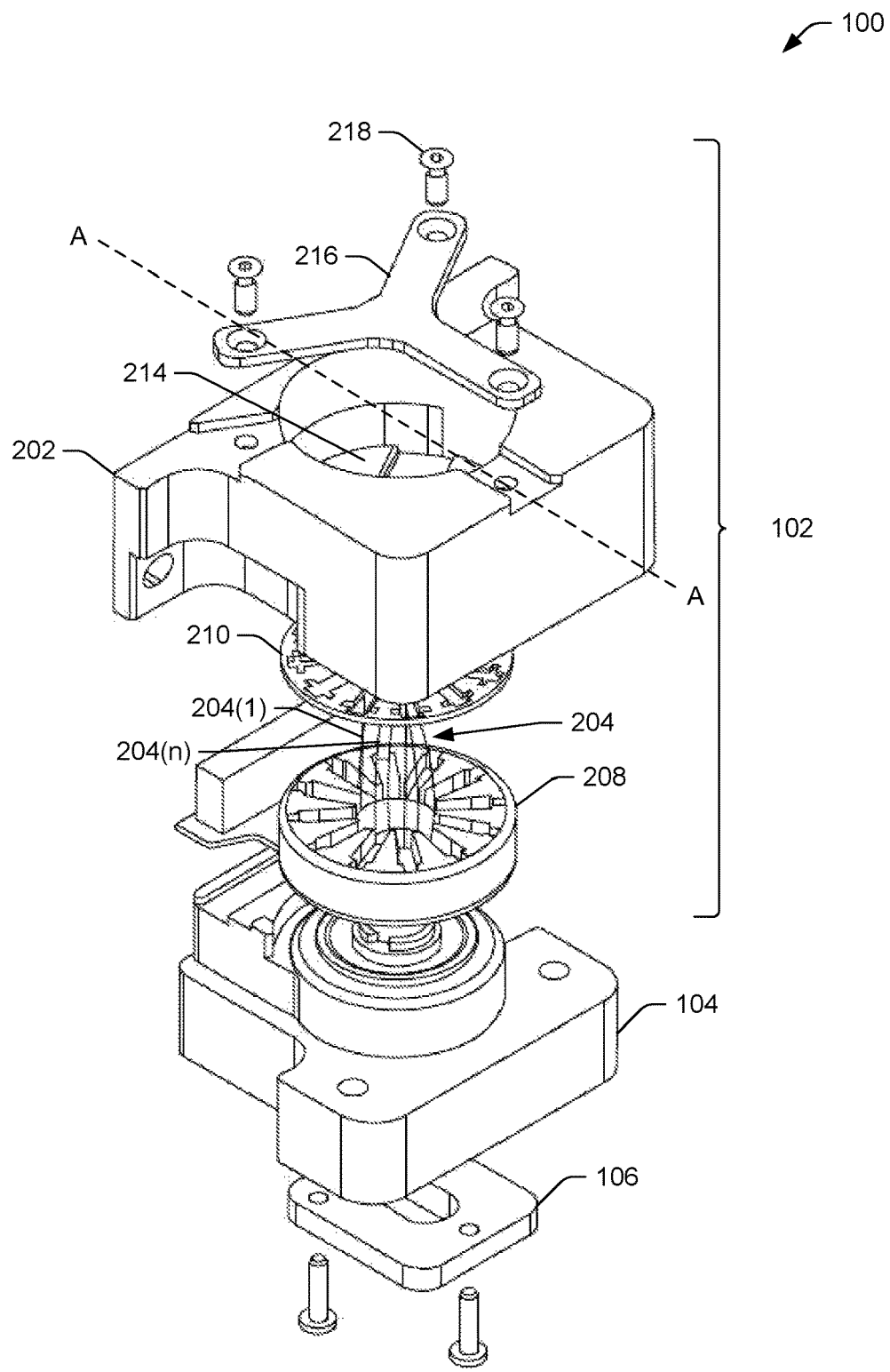
FIG. 2A illustrates an exploded isometric view of an embodiment of a dot matrix transfer head.
Figure 2B:
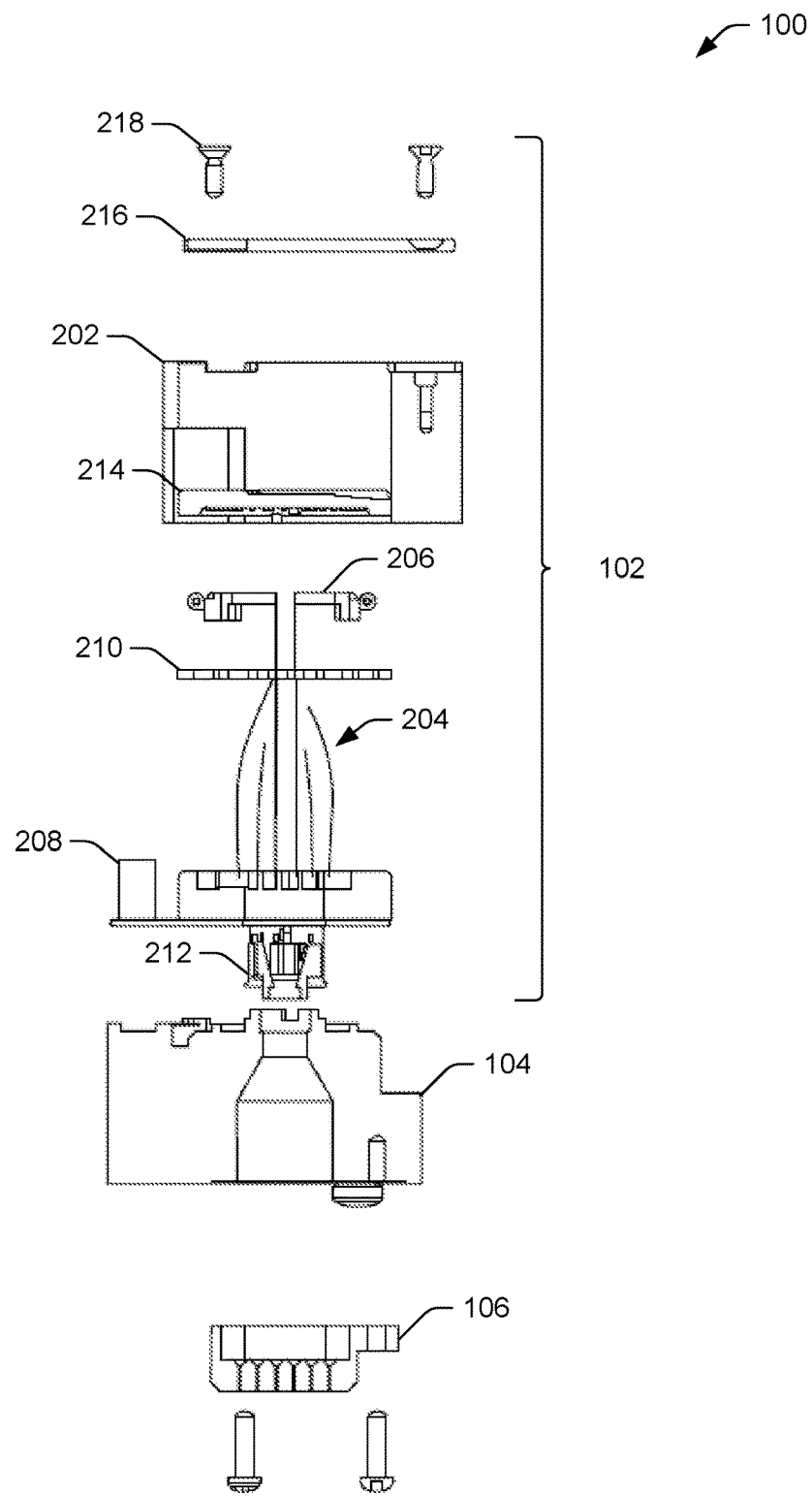
FIG. 2B illustrates a cross-sectional front view of an embodiment of an exploded view of a dot matrix transfer head taken along line A-A in FIG. 2A.

FIG. 2A illustrates an isometric exploded view of an embodiment of the dot matrix transfer head 100. FIG. 2A depicts an example of a number of subcomponents, previously mentioned, that may be included in each of the impact wire housing 102, the splaying element 104, and the guide head 106, in an embodiment. The components and subcomponents will be described further with respect to FIGS. 2A and 2B. FIG. 2B illustrates a cross-sectional front exploded view of an embodiment of the dot matrix transfer head 100 taken along line A-A in FIG. 2A.

In an embodiment, the impact wire housing 102 may include a housing element 202 (referred to hereinafter as the "housing"). The housing 202 may be configured to accommodate and/or house one or more components and/or subcomponents. For example, as shown in FIGS. 1-2, the housing 202 may include a cavity, in which, one or more other components and/or subcomponents may be disposed within the cavity. Furthermore, the housing 202 may provide an attachment point for one or more other components and/or subcomponents such that the one or more other components and/or subcomponents may be attached to the housing 202. For example, in an embodiment, the housing 202 may provide an attachment point for the splaying element 104. Additionally, and/or alternatively, in an embodiment, the housing 202 may provide an attachment point for the guide 106. In an embodiment, the housing 202 may further include an attachment point for the entirety of the dot matrix transfer head 100 itself, such that the dot matrix transfer head 100 may be attached to a transfer machine, amongst other possibilities (e.g. mounting arms, H-frames, spider frames, robotic arm, etc.).

The impact wire housing 102 may also include a plurality of impact wires 204 (e.g., 204(1) and 204(n)). The plurality of impact wires 204 may be secured within the impact wire housing 102 at a first end of the plurality of impact wires 204. In an embodiment, the plurality of impact wires 204 may be used to directly transfer unpackaged semiconductor die from a wafer tape to a product substrate. Since the dot matrix transfer head 100 may include a plurality of impact wires 204, the dot matrix transfer head 100 may be configured and programmed to transfer multiple semiconductor die concurrently. Additionally, and/or alternatively, the dot matrix transfer head 100 may implement the plurality of impact wires 204 to transfer multiple semiconductor die sequentially. Though depicting six impact wires 204 in FIG. 2A, in an embodiment, a dot matrix transfer head 100 may include two or more impact wires 204. For example, the plurality of impact wires 204 may include impact wires in quantities of 2, 3, 6, 12, 24, etc., and anywhere in between or greater than the example quantities.

Regardless of the quantity, individual impact wires of the plurality of impact wires may be independently-actuatable, enabling individual impact wires of the plurality of impact wires 204 to be actuated solitarily and/or in one or more groups. That is, for example, the dot matrix transfer head 100 may actuate a single impact wire 204(1) at a time, two or more impact wires 204(n) at a time, and/or all of the plurality of impact wires 204. In such an embodiment, the implementation of a head or a cluster of a plurality of impact wires 204 allows the transfer mechanism to transfer die in a manner that may be more efficient than a mechanism implementing a single impact wire. For example, as the dot matrix transfer head 100 moves over a product substrate, a transfer mechanism implementing a plurality of impact wires 204 may be able to transfer more than one die at a time. Transferring multiple die via a head containing a plurality of impact wires 204 or a cluster of a plurality of needles 204 may significantly reduce total transfer time, as well as reducing the travel distance that the transfer mechanism would otherwise need to move. In an embodiment, the plurality of impact wires 204 may actuate concurrently or sequentially. However, in another embodiment, one or more than one, but fewer than all, of the plurality of impact wires may be actuated at a same time or substantially the same time, as mentioned above.

In an embodiment, the plurality of impact wires 204 may be disposed and organized in a cluster. The cluster of impact wires 204 may include a patterned cluster having impact wires spaced apart from each other at predetermined distances from one another, at least in an actuated position. For example, the impact wires 204 may be positioned in a cluster such that the impact wires 204 are arranged the same as or similar to the arrangement and orientation of impact wires (also known as impact pins) in a dot matrix printer head configuration. In an example embodiment, the impact wires 204 may form a m×n matrix, wherein m and n include any real number. Typically, an m×n matrix may include m number of impact wires in a row and n number of wires in a column. For example, the cluster of impact wires 204 may include a 3×1 matrix. In another example, the impact wires 204 may be clustered in a 6×2 matrix, where there are six rows of impact wires 204 and two columns of impact wires 204. Such a "dot matrix" style configuration may include evenly spaced impact wires 204. However, in another embodiment, the cluster of impact wires 204 may include irregularly spaced impact wires 204. Additionally, and/or alternatively, in an embodiment, the impact wires in a column may have a first spacing distance and the wires in a row may have a second spacing distance that is different than the first spacing distance, or vice versa. Other spacing configurations not explicitly stated herein are contemplated for the cluster of impact wires 204, as the spacing may depend on the requirements associated with a custom product need. Nevertheless, it is contemplated that such custom configurations still fall within the instant disclosure. For example, while described as a dot matrix transfer head 100, the dot matrix transfer head 100 may configure the cluster of impact wires 204 in a configuration that is not a matrix configuration. It is thus contemplated that the dot matrix transfer head 100 may configure the cluster of impact wires 204 in any pattern.

Referring to FIG. 2B, in an embodiment, the plurality of impact wires 204 may be connected to multiple actuators 206 or multiple actuating elements, respectively. As shown in FIG. 2B, the multiple actuators may be included in the impact wire housing 102. In another embodiment, the plurality of impact wires 204 may be connected to a single actuator. Notably, in any embodiment, the plurality of impact wires 204 may include an actuating element 206 for each individual impact wires 204(1), 204(n), etc., and the independently controllable actuating elements may be clustered within a single actuator unit (e.g., like the impact pins in a dot matrix print head). In such an embodiment, each actuating element 206 may be communicatively coupled to a controller (not shown) that is configured to activate the actuating elements 206.

In an embodiment, the controller (not shown in FIG. 2A) may further be configured to track wear and/or use on one or more components and subcomponents of the dot matrix transfer head 100. For example, the controller may be configured to track a count of transfers that at least one of and/or each of the impact wires have completed. Since the plurality of impact wires 204 complete multiple high speed transfers each second with extreme accuracy, it is important to track and know when the plurality of impact wires 204 may begin to wear. This may increase the accuracy of transferring the semiconductor device die, while decreasing the possibility of damaging a semiconductor device die during the transfer process.

The impact wire housing 102 may also include an actuator retainer 208. The actuator retainer 208 may be a substantially circular shaped portion and is configured to accommodate the multiple actuators 206. As shown in FIG. 2A, the actuator retainer 208 may include actuator shaped slots to accommodate the actuators 206. In an embodiment, the actuator retainer 208 may communicate electrical signals from a controller to the multiple actuators 206 to actuate the multiple actuators 206. While shown as having a substantially circular shaped configuration, the actuator retainer 208 may have any desired shape. For example, in an embodiment, the actuator retainer 208 may have a substantially rectangular shaped portion. In such an embodiment, the actuator retainer 208 may accommodate the multiple actuators 206 in two opposite rows of actuators.

The impact wire housing 102 may further include a retainer bracket 210. In an embodiment, the retainer bracket 210 may be disposed on top of the actuator retainer 208. The retainer bracket 210 is configured to retain a position of each of the multiple actuators 206, for example, by way of a slot shaped to accommodate a pin located on each of the respective multiple actuators 206, as shown in FIG. 2A. The pin may maintain a position of a portion of the multiple actuators 206, such that the multiple actuators 206 may be able to rotate around an axis extending along a length of the pin. The retainer bracket 210 may be shaped corresponding to the actuator retainer 208. For example, if the actuator retainer 208 includes a substantially circular portion, then the retainer bracket 210 may also be shaped substantially circular.

The impact wire housing 102 may include one or more return springs 212. The one or more return springs 212 may be disposed adjacent a bottom surface of each of the multiple actuators 206. Furthermore, the one or more return springs 212 may be disposed in a center cavity in the actuator retainer 208. In an embodiment, the one or more return springs 212 may force the multiple actuators 206 back into a neutral state after actuation. For example, an actuator may actuate downward, moving one or more of the plurality of impact wires downward. The actuator may then press against at least one of the multiple return springs. In an embodiment, once the actuation is complete, the return spring may push the actuator back into a neutral state.

The impact wire housing 102 may also include an actuator cap 214, in an embodiment. The actuator cap 214 may be disposed on top of the retainer bracket 210 and the multiple actuators 206. The actuator cap 214 may serve to cover the multiple actuators 206 and the retainer bracket 210. Optionally, in an embodiment, electrical signals may be communicated to the multiple actuators 206 via the actuator cap 214. However, as described above, in an embodiment, electrical signals may be communicated to the multiple actuators 206 via the actuator retainer 208.

In an embodiment, the impact wire housing 102 may include a bracket 216. The bracket 216 may be configured to maintain a position of the subcomponents (i.e., actuator retainer 208, retainer bracket 210, etc.) of the impact wire housing 102. For example, the bracket 216 may attach to the housing 202 so as to maintain a position of the actuator cap 214, the retainer bracket 210, the multiple actuators 206, the actuator retainer 208, and/or the one or more return springs 212. In such an example, the bracket 216 may maintain the position of some or all of the above listed subcomponents by containing and/or sandwiching the subcomponents between the bracket 216 and the splaying element 104. The bracket 216 may be fastened to the housing 202 via one or more fasteners 218.

Figure 3:
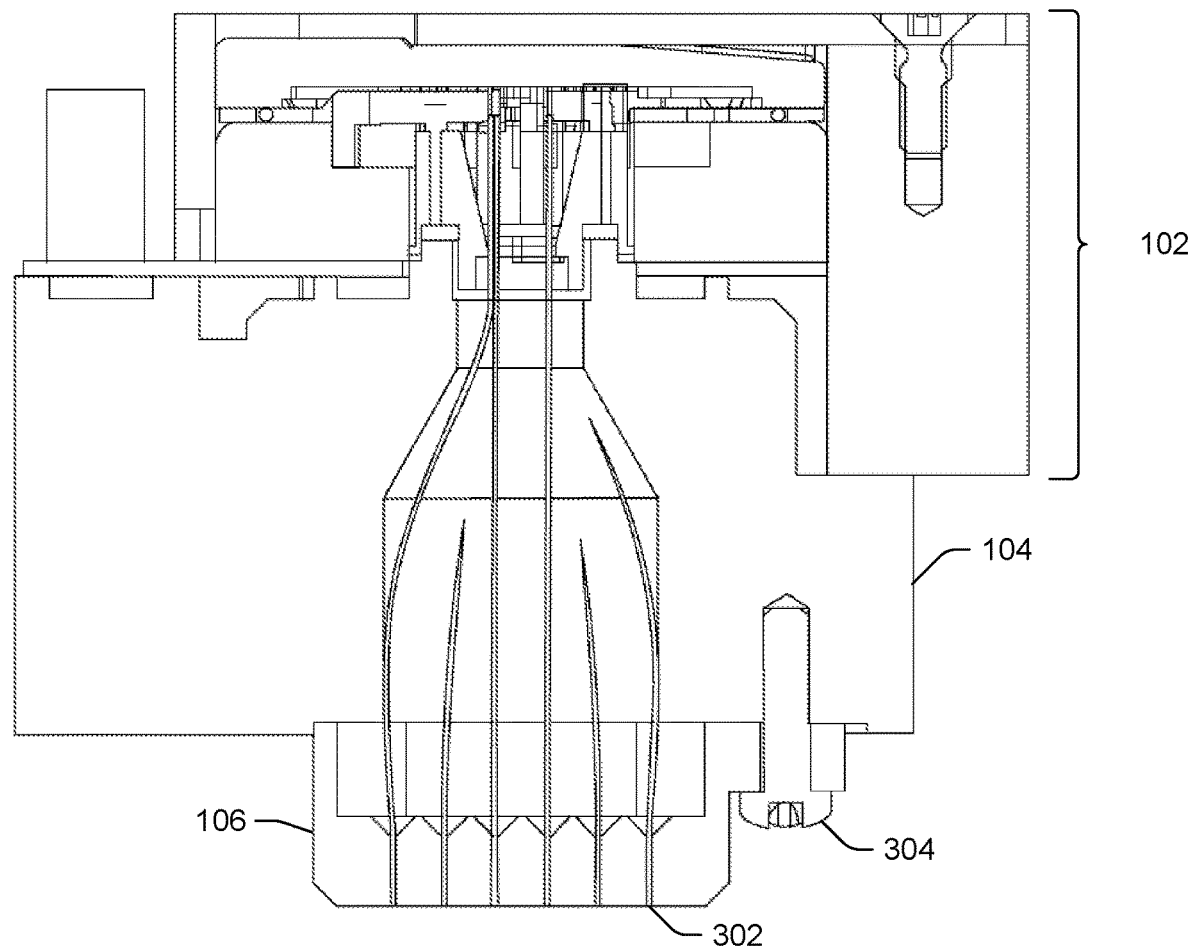
FIG. 3 illustrates a cross-sectional front view of an embodiment of a dot matrix transfer head taken along line B-B in FIG. 1A.

As mentioned previously, the dot matrix transfer head 100 may include a splaying element 104 attached to the impact wire housing 102. For example, the splaying element 104 may be attached to a bottom surface of the impact wire housing 102 as shown in FIGS. 1 and 3. However, in an embodiment, the splaying element 104 may be incorporated as a part of the housing 202 and/or the impact wire housing 102. As shown in FIG. 3, the splaying element 104 may direct the cluster of impact wires 204 along predetermined paths. That is, the splaying element 104 may be configured to splay the plurality of impact wires 204 away from each other. Typically, in a dot matrix print head, the print head may include a guide that guides the impact wires to converge towards one another. However, in the instant application, the splaying element 104 may be configured to direct the plurality of impact wires 204 such that the impact wires 204 diverge from each other. The splaying element 104 may diverge (or "splay") the plurality of impact wires 204 to achieve a desired spacing between each impact wire of the plurality of impact wires 204. For example, the plurality of impact wires 204 may enter the splaying element 104 at a first distance from each other and may exit the bottom of the splaying element 104 at a second distance from each other that is different than the first distance. In such an example, the second distance may be greater than the first distance. Furthermore, the splaying element 104 accommodates the plurality of impact wires 204 in an m×n matrix.

As shown in FIG. 3, in an embodiment, the splaying element 104 may diverge the plurality of impact wires 204 and direct them such that the plurality of impact wires 204 may be inserted into multiple holes 302, respectively, in the guide head 106. Whereby a single impact wire of the plurality of impact wires 204 is inserted into a single hole of the multiple holes 302 to maintain a position of each of the plurality of impact wires 204. For example, the multiple holes 302 may be configured in an m×n matrix configuration. In such an example, the plurality of impact wires 204 may be inserted into the multiple holes 302 in the guide head 106 thereby guiding the plurality of impact wires 204 to actuate in an m×n matrix configuration (e.g., a 6×2 matrix configuration, where there are six rows of holes and two columns of holes). Additionally, the guide head 106 is configured to be easily replaced by another guide head having the same or a different configuration. For example, a first guide head may be attached to the dot matrix transfer head 100 having a 6×2 matrix configuration for use on a first circuit design. Upon switching to perform transfers in a second circuit design that is distinct from the first circuit design, a second guide head, having a 4×3 matrix or other configuration, may be attached to the dot matrix transfer head 100, thereby replacing the first guide head.

In an embodiment, the guide head 106 may be removably attachable to the dot matrix transfer head 100 so as to align with the splaying element 104. In one embodiment, the splaying element 104 may include a cavity sized to accommodate insertion of a portion of the guide head 106. In an alternative embodiment (not shown), the guide head 106 may be flush with a lower surface of the splaying element 104. Regardless, the guide head 106 may be attachable to the splaying element 104 via a direct connection element between the guide head 106 and the splaying element 104, or alternatively, via an indirect connection element between the guide head 106 and another component, such as the impact wire housing 102. For example, in an embodiment of a direct connection element, the guide head 106 may be attached to the splaying element 104 via one or more removable fasteners 304 that secure the guide head 106 in place via a hole therein aligned with a hole in the splaying element 104 to receive the fastener 304. It is contemplated that in an embodiment of an indirect connection element (not shown), the guide head may be secured via an attachment side of the guide head 106 to a component other than the splaying element. Moreover, the one or more fasteners 304 may include at least one of: a screw, a bolt, an adhesive, a clamping mechanism, a magnetic attraction, etc.

In the event that the change in guide head causes the extension length, either actuated or at rest, of one or more of the wires to be different than one or more of the other wires, it is contemplated that vertical positioning of the one or more wires may be adjusted according to the different guide heads. It may be advantageous to maintain the respective ends of the plurality of wires at a same vertical position. Alternatively, it may be advantageous, depending on the circumstance, to permit different vertical positions. For example, the adjustment may be performed automatically by the actuator or other component of the device, or may be performed manually by an operator.

As mentioned previously, the guide head 106 may be configured to be easily interchangeable with other guide heads. In an embodiment, the guide head 106 may be interchanged with another guide head without having to remove any of the other components of the dot matrix transfer head 100. For example, as shown in FIG. 3, the impact wire housing 102 and the splaying element 104 may be disposed adjacent to each other and may be coupled to each other through any coupling means, while the guide head 106 may be removably attached to a bottom surface of the splaying element 104 via fastener 304. In such an example, the guide head 106 and/or other guide heads may be attached to the dot matrix transfer head 100 using an upward motion in the X direction. In other words, the guide head 106 may be configured to removably attach to the splaying element 104 in a direction that is coincident with a direction of extension of the plurality of impact wires 204 while the plurality of impact wires 204 are secured within the impact wire housing 102. Since the guide head 106 is configured to arrange the plurality of impact wires 204 in a matrix configuration, this may allow the plurality of impact wires 204 to remain in a neutral state while the guide head 106 is removed or attached. In an embodiment, the neutral state may refer to a state in which the plurality of impact wires 204 are secured in the impact wire housing, inserted in and through the splaying element 104, and the plurality of impact wires 204 are in a pre-transfer (or retracted) position.

Additionally, and/or alternatively, in an embodiment, the splaying element 104 may be configured to be removeable and/or interchangeable with other splaying elements. For example, it is contemplated that, when changing from one guide head to another, the splaying element may also be interchanged for another splaying element to accommodate the configuration of holes on the new guide head. In another embodiment, the splaying element 104 may be configured to accommodate a wide range of guide heads having various configurations of holes to accommodate a plurality of wires. In such an embodiment, the splaying element 104 would not need to be removed when exchanging the guide head 106 for another guide head.

Figure 4:
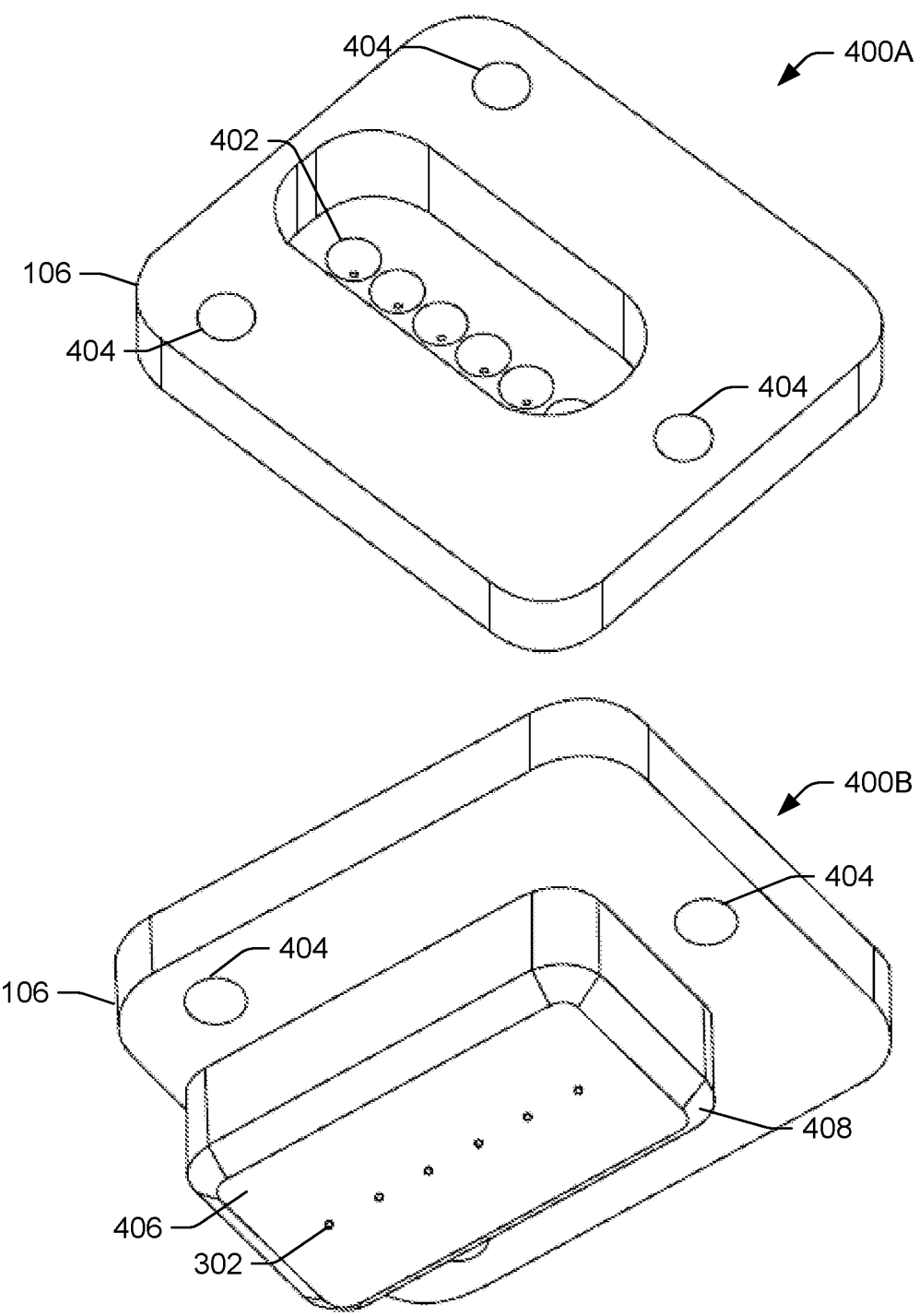
FIG. 4 illustrates a top perspective view and a bottom perspective view of a first embodiment of a guide head component of an embodiment of a dot matrix transfer head.

FIG. 4 depicts a top perspective view 400A and a bottom perspective view 400B of an embodiment of the guide head 106. As seen in FIG. 4, and described above, the guide head may include multiple holes 302 to accommodate the plurality of impact wires (described above and not shown in FIG. 4). In an embodiment, one or more of the multiple holes 302 may include a frustoconical bevel 402 on an attachment side of the guide head 106. The bevel 402 may assist the plurality of impact wires 204 to funnel toward and through the multiple holes 302, thus aiding in the exchange of one guide head for another guide head.

As also shown in FIG. 4, in an embodiment, the guide head 106 may further include one or more fastener openings 404 configured to accommodate one or more fasteners (not shown) that may secure the guide head 106 to the dot matrix transfer head 100. While FIG. 4 depicts the guide head 106 as having three fastener openings 404, the guide head 106 may include any number of fastener openings 404 sufficient to maintain guide head 106 in alignment with splaying element 104. When in use, the guide head 106 may be implemented in the dot matrix transfer head such that a base side 406 of the guide head 106 may face and contact a surface of a substrate, such as a wafer tape from which a transfer of a semiconductor die is intended. For example, the base side 406 of the guide head 106 may contact and/or slide along a first side of a wafer tape during the transfer process. However, depending on the circumstances, the dot matrix transfer head 100 may be implemented to maintain the guide head 106 in close proximity to the surface of the substrate rather than in direct, constant contact. As shown in FIG. 4, the base side 406 of the guide head 106 may include a bevel 408 around the outside edge of the base side 406. The bevel 408 may assist the guide head 106 to smoothly contact and/or glide over a surface of a substrate (such as described above).

Figure 5:
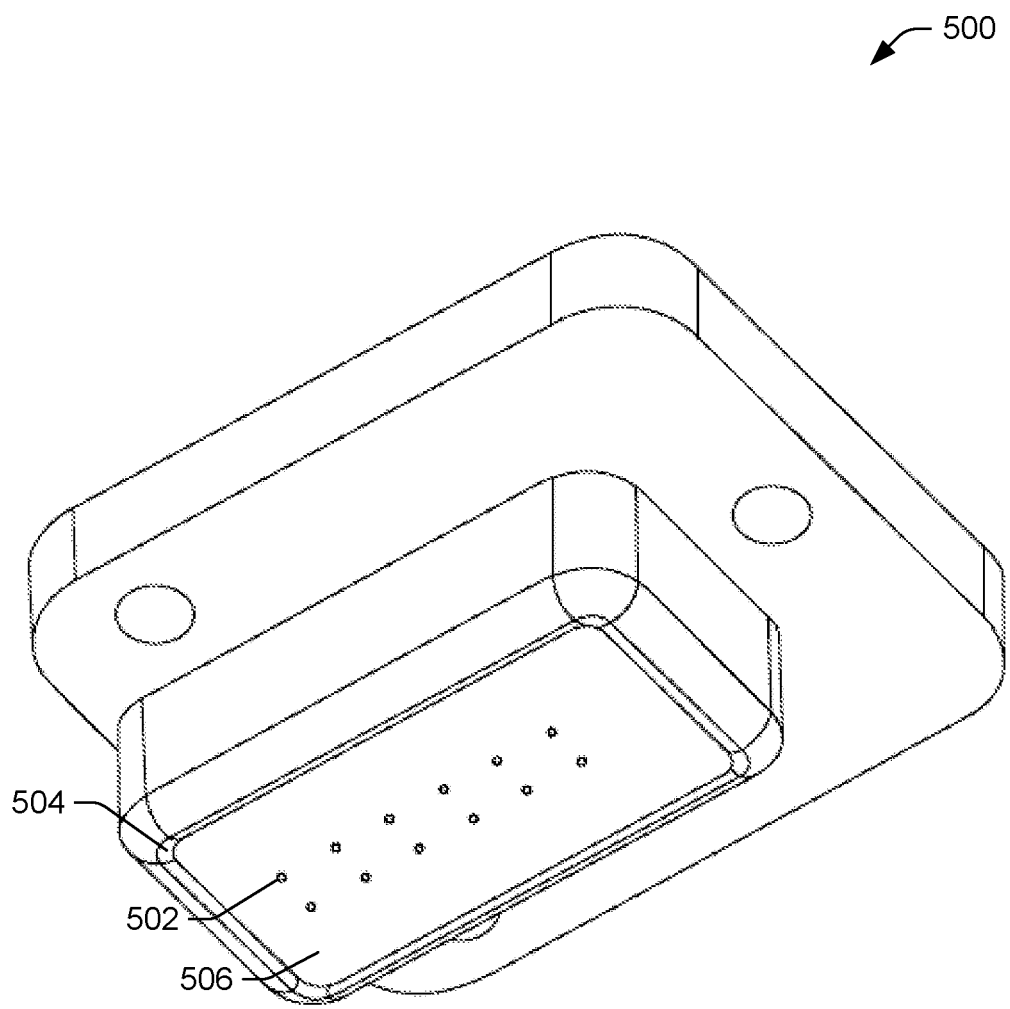
FIG. 5 illustrates a bottom perspective view of a second embodiment of a guide head component of an embodiment of a dot matrix transfer head.

FIG. 5 depicts a bottom perspective view of another embodiment of a guide head 500 of a dot matrix transfer head. As seen in FIG. 5, the guide head 500 includes multiple holes 502 arranged in a matrix configuration, different than that of the guide head 106 shown in FIGS. 1-4. Moreover, as indicated above, while the holes 502 are depicted as arranged in a uniformly spaced matrix, a guide head may include multiple holes arranged in a non-uniform pattern (not shown).

FIG. 5 further depicts the guide head 500 as having a raised outside edge 504. That is, a portion of the perimeter of the bottom side of the guide head 500 protrudes as a lip around the inner surface of the bottom side of the guide head 500 so as to form a shallow cavity from which the impact wires extend. The raised outside edge 504 of the guide head 500 may serve to reduce the surface area of contact between the guide head 500 and a substrate. For example, when in use, when the guide head 500 contacts a substrate, instead of the entire surface 506 of the bottom side of the guide head 500 contacting the substrate, only the raised outside edges 504 may contact the substrate, thereby reducing the overall potential friction between adjacent surfaces. The raised outside edges 504 may also allow the plurality of impact wires to extend slightly past the bottom surface 506 of the guide head 500 without contacting the substrate against which the raised outside edges 504 are in contact. Additionally, the raised outside edges 504 of the guide head 500 may serve to aid in a transfer process. For example, upon transferring a semiconductor device die from the wafer tape to a product substrate, an impact wires of the plurality of impact wires may retract to a neutral position. During this retraction, the wafer tape may stick to the impact wire being retracted. The raised outside edges 504 may help detach the wafer tape from the impact wire without the impact wire having to retract into the guide head 500. The raised outside edges 504 may also make it less likely that the guide head 500 may catch on a substrate that the guide head is sliding across. This may allow the dot matrix transfer head to slide along a substrate rather than having to lift up off the substrate and contacting it again for the next transfer operation. However, it is contemplated that the dot matrix transfer head may maintain contact with the substrate throughout the transfer operation.

CONCLUSION

Although several embodiments have been described in language specific to structural features and/or methodological acts, it is to be understood that the claims are not necessarily limited to the specific features or acts described. Rather, the specific features and acts are disclosed as illustrative forms of implementing the claimed subject matter. Furthermore, the use of the term "may" herein is used to indicate the possibility of certain features being used in one or more various embodiments, but not necessarily in all embodiments.

What is claimed is:

1. A dot matrix transfer head, comprising:
    an impact wire housing;
    a plurality of impact wires disposed within the impact wire housing and extending out of the impact wire housing;
    a splaying element attached to a bottom surface of the impact wire housing, wherein the plurality of impact wires extend into and through the splaying element; and
    a guide head attached to a bottom surface of the splaying element, the guide head including multiple holes configured to arrange the plurality of impact wires in a matrix configuration,
    wherein the splaying element is configured to direct the plurality of impact wires towards the multiple holes in the guide head.

2. The dot matrix transfer head according to claim 1, wherein the guide head is configured to be interchangeable with another guide head while the plurality of impact wires remain in a neutral state.

3. The dot matrix transfer head according to claim 2, wherein the neutral state refers to a state in which the plurality of impact wires are secured within the impact wire housing, inserted through the splaying element, and in a pre-transfer position.

4. The dot matrix transfer head according to claim 1, wherein the guide head includes an attachment side and a base side.

5. The dot matrix transfer head according to claim 4, wherein each of the multiple holes include a taper extending from the attachment side towards the base side, such that the taper forms a bevel around an opening of each hole.

6. The dot matrix transfer head according to claim 1, wherein the guide head includes raised outer edges around an edge of the base side of the guide head.

7. The dot matrix transfer head according to claim 1, wherein the plurality of impact wires includes one or more actuators to actuate the plurality of impact wires.

8. The dot matrix transfer head according to claim 7, wherein the one or more actuators are communicatively coupled to a controller that is configured to activate the one or more actuators.

9. An apparatus for executing a direct transfer of one or more semiconductor device die from a wafer tape to a substrate, the apparatus comprising:
an impact wire housing configured to house multiple impact wires, wherein the multiple impact wires are secured within the impact wire housing at a first end of the multiple impact wires;
an actuator communicatively coupled to a controller configured to actuate the multiple impact wires;
a splaying element disposed adjacent the impact wire housing, wherein the multiple impact wires extend out of the impact wire housing and through the splaying element, the splaying element configured to spread the multiple impact wires away from each other; and
a guide having a plurality of holes removably attached to the splaying element in direction coincidental with a direction of extension of the multiple impact wires, wherein the multiple impact wires extend at least partially into the plurality of holes.

10. The apparatus according to claim 9, wherein the actuator includes a single actuating element responsible for actuating each of the multiple impact wires, such that the actuator actuates the multiple impact wires independent from one another.

11. The apparatus according to claim 9, wherein the plurality of holes of the guide head are configured in a matrix pattern.

12. The apparatus according to claim 9, wherein the apparatus further comprises a controller that is configured to track usage of at least one of the actuator or the multiple impact wires.

13. The apparatus according to claim 9, wherein the impact wire housing, the multiple impact wires, the actuator, and the splaying element remain in place while the guide is interchanged with another guide.

* * * * *